US005805000A

United States Patent [19]

Kato

[11] Patent Number: 5,805,000

[45] Date of Patent: Sep. 8, 1998

[54] LOGICAL LOSE-GAIN CIRCUIT AND ELECTRONIC DEVICE HAVING LOGICAL LOOSE-GAIN CIRCUIT

[75] Inventor: Kazuo Kato, Chiba, Japan

[73] Assignee: Seiko Instruments Inc., Japan

[21] Appl. No.: 733,968

[22] Filed: Oct. 18, 1996

[30] Foreign Application Priority Data

Oct. 30, 1995 [JP] Japan .................................... 7-282159

[51] Int. Cl.[6] .................................................... H03K 21/00

[52] U.S. Cl. .......................... 327/115; 327/118; 327/163; 331/177 R; 331/178; 368/201

[58] Field of Search .................................... 327/113, 114, 327/115, 117, 118, 141, 162, 163; 331/176, 177 R, 178; 368/200–203; 968/900–905; 377/47, 76–78

[56] References Cited

U.S. PATENT DOCUMENTS

| | | | |
|---|---|---|---|
| 4,300,224 | 11/1981 | Nakazaki et al. | 368/201 |
| 4,408,897 | 10/1983 | Mutrux | 368/200 |
| 4,461,582 | 7/1984 | Walther | 368/201 |
| 4,553,850 | 11/1985 | Kanno | 368/201 |
| 4,779,248 | 10/1988 | Odagiri et al. | 368/202 |
| 5,195,063 | 3/1993 | Moriya | 368/85 |

*Primary Examiner*—Timothy P. Callahan
*Assistant Examiner*—Kenneth B. Wells
*Attorney, Agent, or Firm*—Adams & Wilks

[57] ABSTRACT

A regulating circuit for a quartz crystal oscillator-based timepiece is capable of compensating for large deviations in oscillation frequency of the quartz crystal oscillator. A frequency divider sequentially divides the reference clock by one-half. A regulation data setting circuit sets logical regulation data used to compensate for deviations in the oscillation frequency of the oscillator from a desired value. A regulation circuit adjusts the frequency dividing ratio of the frequency dividing circuit based on the logical regulation data in accordance with a predetermined cycle and controls in such a manner that the frequency of a divided output signal of the frequency divider has a predetermined frequency. When the frequency of the divided output signal cannot coincide with the predetermined frequency using the set logical regulation data, the range of adjustment is shifted using data set in a switch during production of the timepiece.

14 Claims, 7 Drawing Sheets

LOGICAL LOSE-GAIN CIRCUIT AND ELECTRONIC DEVICE HAVING LOGICAL LOOSE-GAIN CIRCUIT

BACKGROUND OF THE INVENTION

The present invention relates to a logical lose-gain circuit, for performing fine adjustment of time precision and to an electronic device such as an electronic watch that achieves high time precision by using the-logical lose-gain circuit.

Conventionally, there has been adopted a method for performing a regulating or logical lose-gain operation in accordance with one cycle of a frequency division clock using a circuit such as shown in FIG. 6, in order to compensate for the deviation of in oscillation frequencies due to uneven quality of quartz oscillators used as master oscillation of an oscillation circuit.

The logical lose-gain operation will now be briefly described with reference to FIG. 6, which is a circuit diagram, and FIG. 7, which is a timing chart. A reference clock a output from a quartz oscillator 601 is input to a frequency division circuit comprised of seven by T flip-flops (which will be referred to as TFFs hereinafter) 602 to 608 to be sequentially frequency-divided. When the logical lose-gain operation is not being performed, the clock a is sequentially subjected to precise ½ frequency division as shown by a section extending from a timing A to another timing B in FIG. 7.

Outputs from OR gates 609 to 612 which receive a logical lose-gain control signal VCWX and logical lose-gain data signals VCWD1 to VCWD4 are connected to set inputs SX of the TFFs 603 to 606, and an output of an OR gate 613 to which VCWD5 and VCWX are input is connected with reset inputs RX of the TFFs 607 and 608.

The logical lose-gain operation is usually performed at 10-second intervals and, at such times this time, a pulse signal VCWX at a "L" level is generated in synchronism with a first transition of a Q output of the TFF 607 at the timing B in FIG. 7. A pulse width of the signal VCWX is half of a cycle of a reference clock. When predetermined ones of the TFFs 603 to 608 are forcibly preset by the "L" level pulse signal VCWX, a predetermined quantity of the logical lose-gain operation is carried out.

For example, if lose-gain data VCDW1 to VCWD5 are at "L", "OH", "H", "H" and "H" levels, respectively, output signals c, d, e, f and g of the OR gates 609 to 612 are output in synchronism with the signal VCWX at "L", "H", "H", "H" and "H" levels, respectively. The "L" level pulse signal is applied to the set input SX of the TFF 603, and the Q output of the TFF 603 is forcibly turned to the "H" level (timing B).

Since a frequency division clock "b" of the TFF 602 is continuously input to the TFF 603. The Q output signal of the TFF 603 displays its next transition at a timing C shown in FIG. 7, and the regular ½ frequency division is thereafter carried out.

With this operation, one section for the Q output from the TFF 603 at "L" level, i.e., a time corresponding to one cycle of the frequency division clock of the TFF 602 is omitted. As viewed from the timing at which the first transition of the Q output signal from the TFF 606 is demonstrated, the signal should have shown its first transition at a timing E in FIG. 7, but it actually displays its first transition at a timing D in FIG. 7. Therefore, the lose-gain operation was consequently carried out for a time corresponding to one cycle of the Q output from the TFF 602 in the advance direction.

It has been known that the logical lose-gain operation in delay or advance direction is carried out by adequately adjusting the operating state of the frequency division circuit at a predetermined timing in accordance with the above-described method.

In the prior art lose-gain method, since the lose-gain range or lose-gain resolution is determined by the number of signal lines included in as the logical lose-gain data input means, a large amount of quartz oscillators having oscillation frequencies that deviate beyond the lose-gain range of the logical lose-gain circuit are generated when that unevenness in quality of quartz oscillators produced by a given manufacturing process is large.

For example, when a quartz oscillator of 32 kHz is used, frequency-dividing stages for outputting 8 kHz, 4 kHz, 2 kHz, 1 kHz and 512 Hz are controlled by five logical lose-gain data signals to perform the logical lose-gain operation, and the lose-gain range corresponds to ±8.4375 sec/day (±97.665 PPM). The quartz oscillator having the oscillation frequency deviation beyond this range can not, therefore, be compensated by the above-mentioned logical lose-gain circuit, and the yield of the quartz oscillator is disadvantageously decreased.

When enlarging the lose-gain range by the prior art logical lose-gain method, it is possible to adopt a method by which a number of logical lose-gain data signals are increased, but a number of input terminals of an IC must be increased and a space of the IC is thereby greatly enlarged, which leads to the problem of incresed cost.

Further, when enlarging the lose-gain range without increasing a number of lose-gain signals by the prior art logical lose-gain method, since the lose-gain resolution is lowered, it is difficult to make an adjustment to obtain a predetermined rate.

SUMMARY OF THE INVENTION

It is an object of the present invention to realize a logical lose-gain circuit having a large adjustment range without increasing a number of terminals of an IC for regulating the frequency dividing ratio of a frequency divider, so that a quartz oscillator having a large oscillation frequency deviation can be adjusted.

It is another object of the present invention to increase the yield of quartz oscillators by using a logical lose-gain circuit having a large adjustment range.

In order to eliminate the above problems, in one aspect of the present invention, a logical lose-gain circuit is provided which comprises an oscillating means for outputting a reference clock, a frequency-dividing means for receiving and sequentially frequency-dividing the reference clock, a logical lose-gain data setting means for setting predetermined logical lose-gain data, a logical lose-gain means for operating a state of the frequency dividing means at predetermined periods based on the logical lose-gain data set in the logical lose-gain data setting means, and a logical lose-gain shift means for arbitrarily shifting a lose-gain range of the logical lose-gain means.

Further, in another aspect of the present invention, an electronic device having a logical lose-gain circuit is constituted by an oscillating means for outputting a reference clock, a frequency dividing means for receiving and sequentially frequency-dividing the reference clock to generate a time reference signal, a logical lose-gain data setting means for setting predetermined logical lose-gain data, and a logical lose-gain means for controlling the frequency dividing means based on the logical lose-gain data set in the logical lose-gain data setting means at predetermined periods to adjust the time precision of the time reference signal. In addition, logical lose-gain shift means are included for shifting a lose-gain range of the logical lose-gain means to shift an adjustment range for time precision of the time reference signal, a display driving means is provided for outputting a display drive output signal based on the time reference signal output from the frequency dividing means, and a display means is provided for receiving the display drive output signal to display time information.

DETAILED DESCRIPTION OF THE PREFERRED EMBODIMENTS

Figure 1:
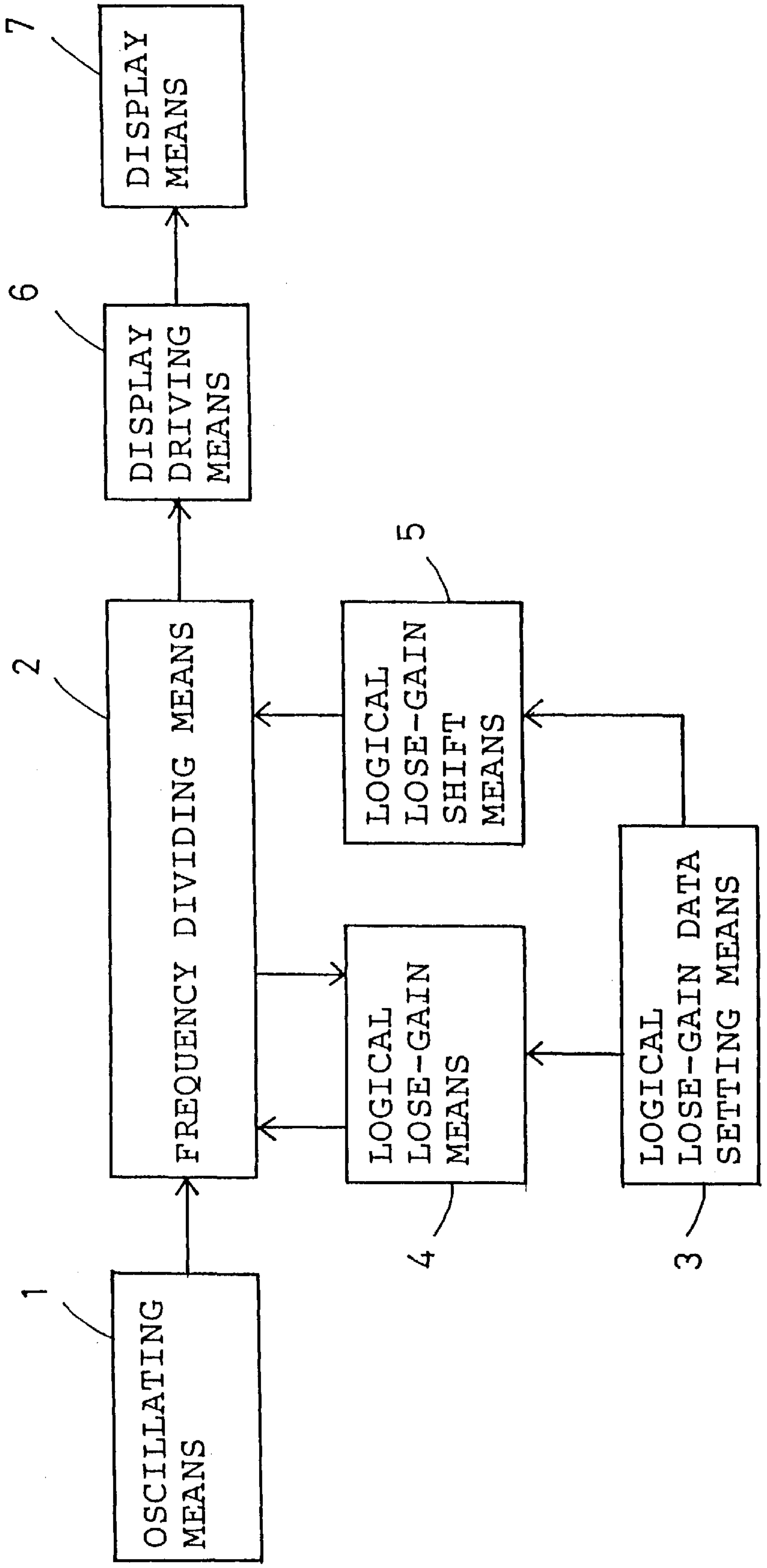
FIG. 1 is a functional block diagram showing an example of a basic configuration according to the present invention.

An embodiment having the above-described configuration according to the present invention will now be described with reference to FIG. 1. An oscillating means 1 having an oscillator such as a quartz crystal as a master oscillation outputs a reference clock, and a frequency dividing means 2 sequentially subjects the reference clock to ½ frequency division. A logical lose-gain data setting means 3 sets logical lose-gain data to compensate for a deviation of the oscillation frequency of the oscillator by a logical circuit. A logical lose-gain means 4 controls a state of the frequency dividing means 2 based on the thus-set logical lose-gain data at predetermined periods and controls the frequency dividing means 2 in such a manner that a cycle of a frequency division output signal of the frequency dividing means 2 coincides with a predetermined cycle. A logical lose-gain shift means 5 shifts a logical lose-gain range in accordance with an oscillation frequency characteristic when the cycle of the frequency division output signal can not coincide with a predetermined cycle based on the set logical lose-gain data. With this logical lose-gain shift means 5, a quartz oscillator group having a large deviation of oscillation frequencies, that was heretofore difficult to adjust and had a low yield, can now be adjusted by the logical lose-gain operation.

Determining the frequency division output signal of the frequency dividing means 2 as a time reference signal, a display driving means 6 generates a display drive output signal for driving a display means 7 such as an analog or optical display unit such as a liquid crystal display unit or a light-emitting diode, based on the time reference signal. In accordance with such an arrangement, it is possible to obtain an electronic device such as an electronic watch that can precisely adjust time information such as current time or elapsed time by a means like a logical circuit.

Figure 2:
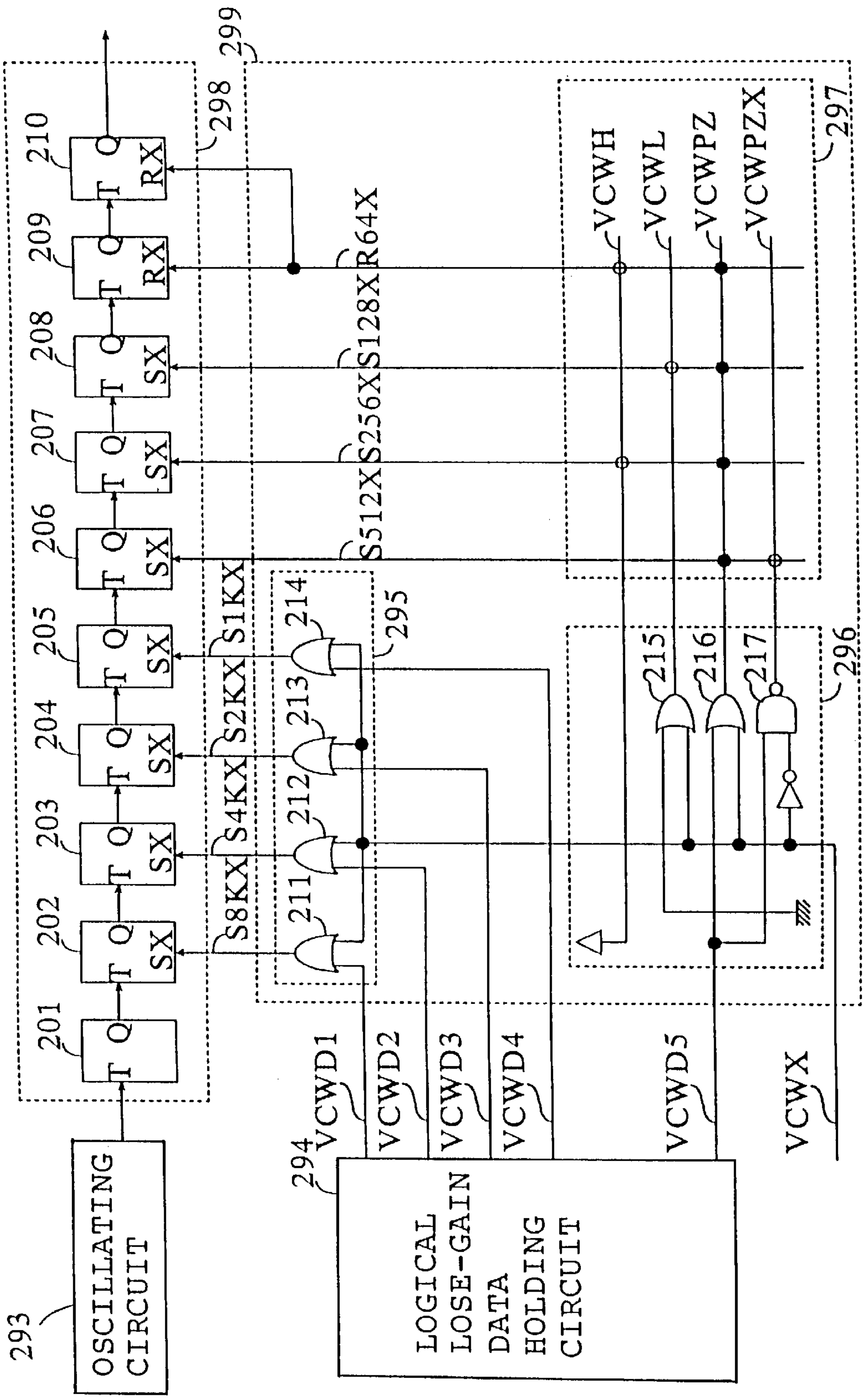
FIG. 2 is a circuit diagram showing an embodiment of a logical lose-gain circuit according to the present invention.

Referring to FIG. 2, a quartz oscillating circuit 293 outputs a reference clock signal. In this embodiment, a frequency of the reference clock is 32 kHz.

A frequency dividing circuit 298 is constituted by 10 stages of TFFs 201 to 210. In order to synthesize a control signal for operating a display drive circuit or the like, a few stages of TFFs are actually connected to a rear side of the TFF 210, but they are omitted herein.

A logical lose-gain circuit 299 receives signals of VCWD1 to VCWD5 output from a logical lose-gain data holding circuit 294 and VCWX that is a control signal synthesized from an output signal of the frequency dividing circuit 298, and outputs logical lose-gain operation signals S8KX, S4KX, S2KX and S1KX for presetting the TFFs 202 to 210 in the frequency dividing circuit 298 and logical lose-gain shift signals S512X, S256X, S128X and R64X in synchronism with VCWX when one or more of signals VCWD1 to VCWD5 are at a "L" level.

A mask option switch 297 is constituted by input signals VCWH, VCWL, VCWPZ and VCWPZX and logical lose-gain shift signals S512X, S256X, S128X and R64X. Each signal line of the logical lose-gain shift signals S512X, S256X, S128X and R64X is connected to one signal line of input signals VCWH, VCWL, VCWPZ and VCWPZX in the IC manufacturing process.

Figure 3:
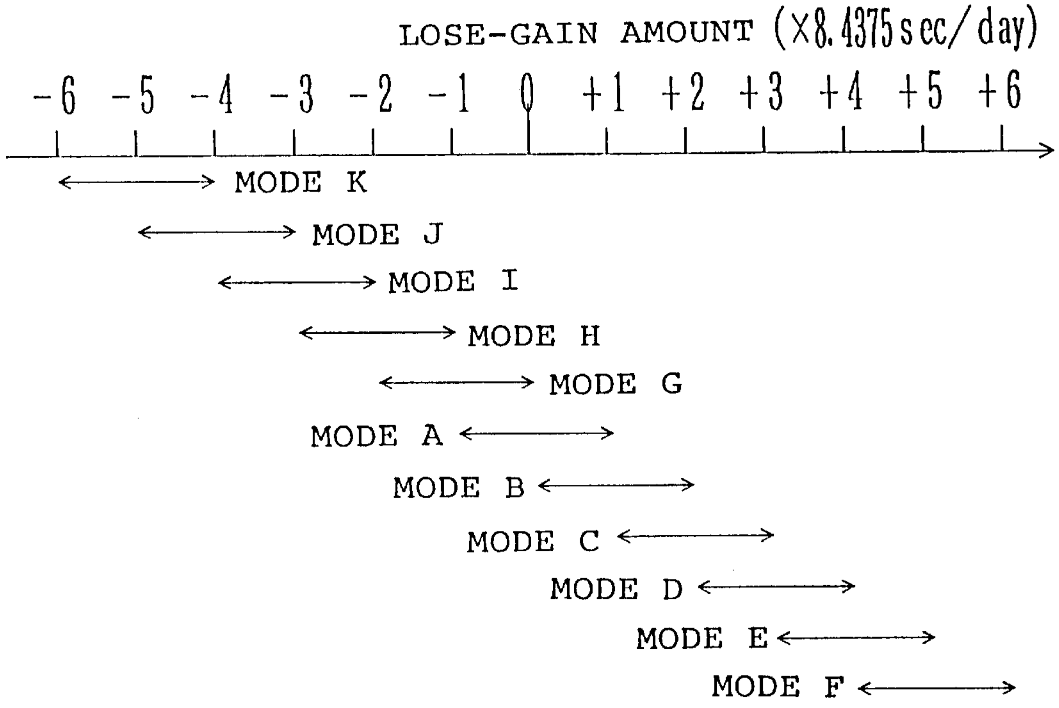
FIG. 3 is a view showing lose-gain modes and lose-gain ranges of the embodiment of the logical lose-gain circuit according to the present invention.

FIG. 3 shows modes of the lose-gain range that can be selected by the connection method for the mask option switch 297. A lose-gain amount is shown with 8.4375 sec/day as a unit. In case of a mode A, the lose-gain range corresponds to units of ±1 (±8.4375 sec/day) and is equal to the lose-gain range described in connection with the prior art configuration. Further, it is possible to arbitrarily set the lose-gain range from a mode K of −6 through −4 units to a mode F of +4 through +6 units in accordance with dispersion in frequencies of quartz oscillators by adequately selecting the mask option switch 297.

For example, when the signal lines of the logical lose-gain shift signals S512X, S256X, S128X and R64X are all connected to a signal line of VCWPZ as indicated by solid circles in the mask option switch 297, the lose-gain range corresponds to the mode A in FIG. 3. Furthermore, when the signal lines of the logical lose-gain shift signals S512X, S256X, S128X and R64X are connected to the signal lines of the input signals VCWPZX, VCWH, VCWL and VCWH, respectively, as indicated by hollow circles in the mask option switch 297, the lose-gain range corresponds to the mode F in FIG. 3.

Figure 4:
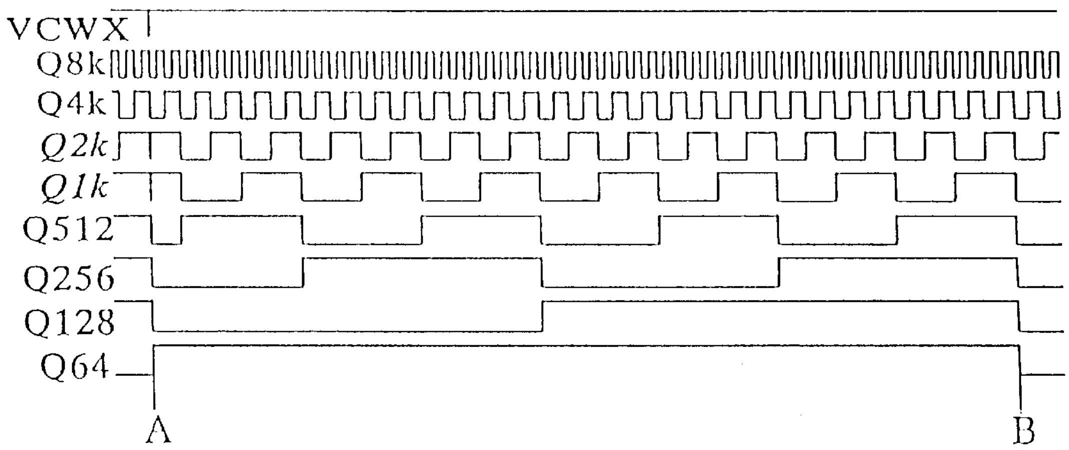
FIGS. 4(*a*) and 4(*b*) are timing charts for the logical lose-gain operation of the embodiment of the logical lose-gain circuit according to the present invention.
Figure 4:
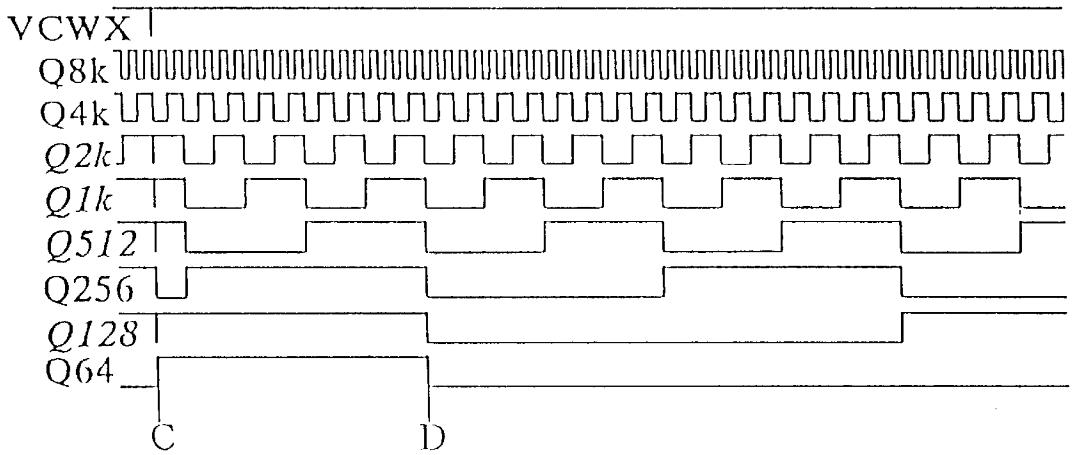

FIGS. 4(*a*) and 4(*b*) are timing charts for the logical lose-gain operation in the present embodiment, wherein FIG. 4(*a*) shows the case where the lose-gain range corresponds to the mode A and the logical lose-gain data signals VCWD1, VCWD2, VCWD3 and VCWD4 are at "H", "H", "L" and "L" levels, respectively. With respect to the logical lose-gain data signals, values set from a non-illustrated external terminal or the like are held by the logical lose-gain data holding circuit 294 shown in FIG. 2.

As to the signal VCWX, a pulse at "L" level is input at a timing A synchronized with a first transition of Q64 at 10-second periods. A logical circuit block 295 is constituted by OR gates 211,212, 213 and 214 and outputs data of the signals VCWD1, VCWD2, VCWD3 and VCWD4 as logical lose-gain operation signals S8KX, S4KX, S2KX and S1KX, respectively, in synchronism with the signal VCWX. The logical circuit block 296 is made up of OR gates 215 and 216 and a NAND gate 217, and outputs data of the signal VCWD5 as VCWPZ and an inverted value of data of the signal VCWD5 as VCWPZX in synchronism with the signal VCWX. The VCWL outputs the "L " level in synchronism with the signal VCWX, and the VCWH is constantly at a "H" level.

The logical lose-gain shift signals S512X, S256X, S128X and R64X output any one of the signals VCWH, VCWL, VCWPZ and VCWPZX, respectively, in accordance with the connection state of the mask option switch 297. When the logical lose-gain operation signals S8KX, S4KX, S2KX and S1KX and the logical lose-gain shift signals S512X, S256X and X128X output pulse signals at a "L" level, the TFFs 202, 203, 204, 205, 206, 207 and 208 are preset, while when the R64X outputs a pulse signal at a "L" level, the TFFs 209 and 210 are reset to perform the logical lose-gain operation.

For example, in case of the mode A where the logical lose-gain data signals VCWD1, VCWD2, VCWD3, VCWD4 and VCWD5 are at "H", "H", "L", "L" and "H" levels, respectively, and the mask option switch is set in such a manner that the logical lose-gain shift signals S512X, X256X, S128X and R64X are all connected with the VCWPZ, the logical lose-gain operation is performed in accordance with a timing chart illustrated in FIG. 4(*a*). That is, the TFFs 204 and 205 are set by the pulse signal VCWX of "L" level that is output in synchronism with a first transition (timing A) of Q64 in FIG. 4(*a*), and the Q2K and Q1K enter "H" level. The regular frequency division operation is thereafter continued and Q64 shows its last transition at the timing B.

Moreover, in case of the mode F where the logical lose-gain shift signals S512X, S256X, S128X and R64X are connected to VCWPZX, VCWH, VCWL and VCWH, respectively, the logical lose-gain operation is carried out in accordance with the timing chart of FIG. 4(*b*). In other words, TFFs 206 and 208 are set simultaneously with TFFs 204 and 205 by the pulse signal VCWX of "L" level that is output in synchronism with a first transition (timing C) of Q64 in FIG. 4(*b*), and Q512 and Q128, as well as Q2K and Q1K, are turned to uHm level. The regular frequency division operation is thereafter continued and Q64 displays its last transition at the timing D.

In this case, the last transition obtained at the timing D is ahead of that at the timing B by five cycles, and this difference corresponds to a shift amount of the lose-gain ranges of the mode A and the mode F.

Figure 5:
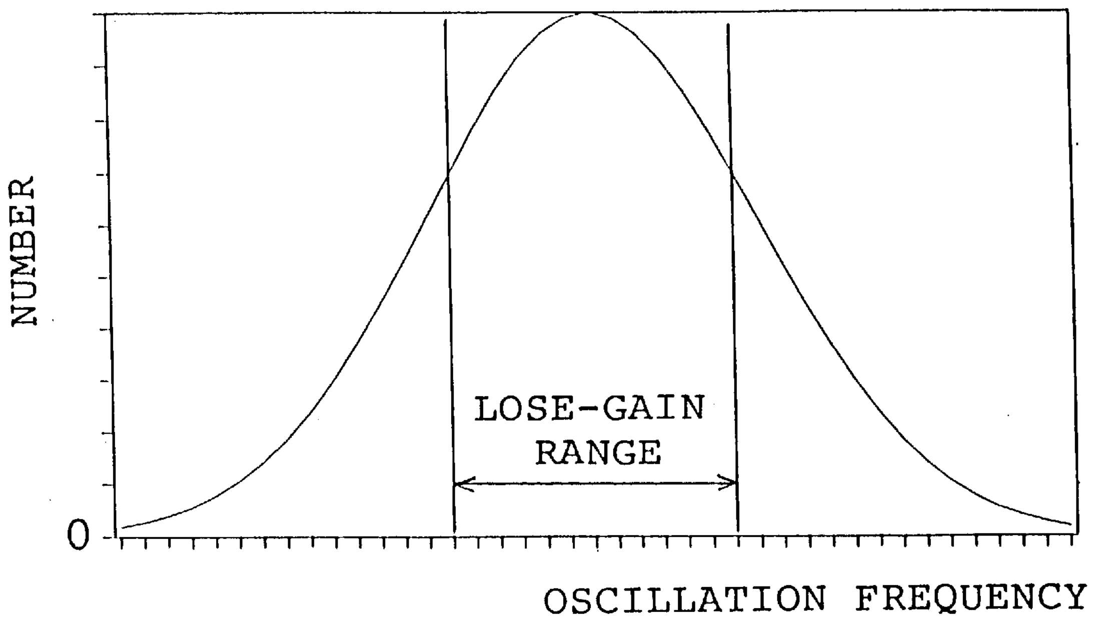
FIG. 5 is a view showing an example of the oscillation frequency distribution of the quartz crystal and the logical lose-gain range.
Figure 6:
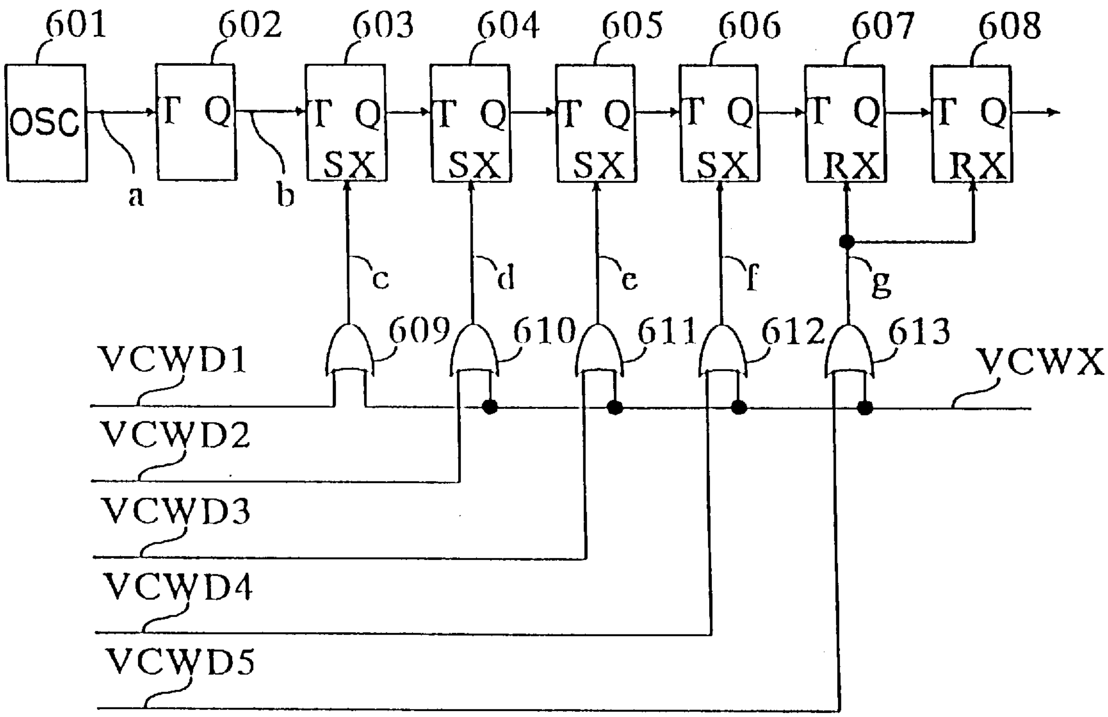
F I G. 6 PRIOR ART
FIG. 6 is a circuit diagram showing a prior art logical lose-gain circuit.
Figure 7:
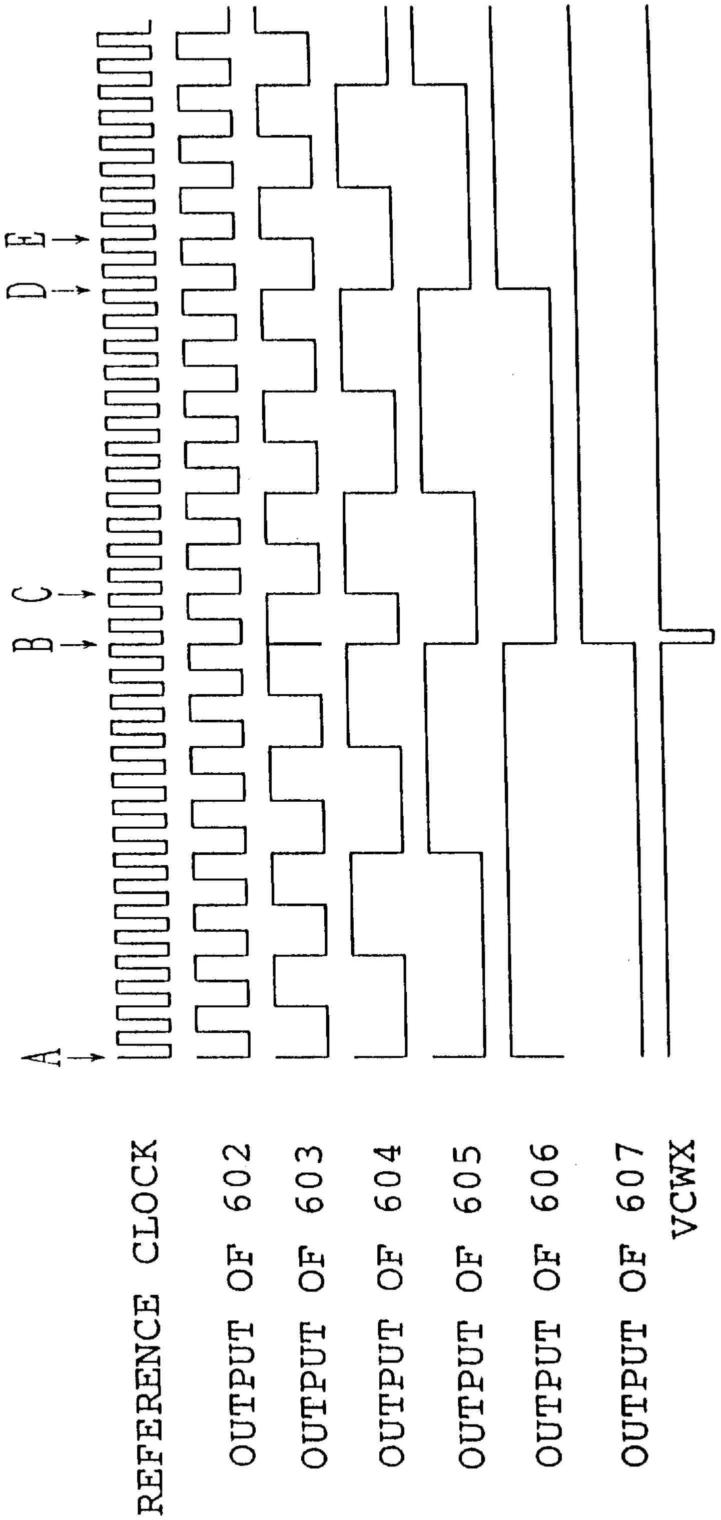
FIG. 7 PRIOR ART
FIG. 7 is a timing chart for the logical lose-gain operation of a prior art logical lose-gain circuit.

FIG. 5 is a view showing a distribution of the oscillation frequencies of the quartz oscillator group obtained during a regular manufacturing process. In accordance with the distribution of the oscillation frequencies, when a quartz oscillator having a oscillation frequency being out of the logical lose-gain range in one of the illustrated logical lose-gain modes is adjusted in another logical lose-gain mode, use of such a quartz oscillator that can not be used in the prior art configuration is enabled. As a result, availability of the quartz oscillator can be improved and reduction in the overall cost can be realized.

The present invention has the above-described structure, and it has, therefore, such advantages as mentioned below. Since the logical lose-gain range can be shifted by the logical lose-gain shift means in accordance with the distribution of the oscillation frequencies of the quartz oscillators, nearly all of the quartz oscillators can be adjusted even when using a quartz oscillator group having a large deviation in oscillation frequencies caused by uneven quality generated during the manufacturing process, thereby reducing the overall cost.

In addition, when the logical lose-gain shift means is incorporated into an IC, a function for shifting the logical lose-gain range can be realized by using the mask option switch without increasing a number of terminals of the IC, and a space of the IC can be hence prevented from increasing, hence realizing the low cost.

What is claimed is:

1. A logical regulating circuit comprising: oscillating means for outputting a reference clock; frequency dividing means for sequentially frequency-dividing the reference clock and producing a divided output signal; logical regulating data setting means for setting predetermined logical regulating data used for selectively altering a frequency dividing ratio of the frequency dividing means to adjust the frequency of the divided output signal to a predetermined value; logical regulating means for adjusting the frequency dividing means at predetermined periods in accordance with the logical regulating data set in the logical regulating data setting means in a forward or reverse direction to control the frequency of the divided output signal to compensate for a deviation in oscillation frequency of the oscillating means from a desired frequency; and means for shifting a range of regulation of the logical regulating means by controlling the logical regulating means to adjust the frequency dividing means such that the frequency of the divided output signal corresponds to the predetermined value.

2. A logical regulating circuit according to claim 1; wherein the oscillating means comprises an oscillating circuit having a quartz crystal oscillator for producing the reference clock.

3. A logical regulating circuit according to claim 2; wherein the reference clock has a first frequency value which deviates from a desired frequency value by a value outside a range of regulation of the logical regulating means.

4. A logical regulating circuit according to claim 1; wherein the logical regulating means includes means for controlling the frequency dividing means such that a selected cycle of a frequency division output signal of the frequency dividing means coincides with a predetermined cycle to thereby compensate for the deviation in oscillation frequency of the oscillating means.

5. A logical regulating circuit according to claim 4; wherein the means for shifting includes means for controlling the logical regulating means to adjust the frequency dividing means only when it is determined that operation of the logical regulating means cannot cause a cycle of the frequency division output signal of the frequency dividing means to coincide with the predetermined cycle.

6. A logical regulating circuit according to claim 4; wherein the means for shifting includes means for controlling the logical regulating means to adjust the frequency dividing means only when it is determined that operation of the logical regulating means cannot cause a cycle of the frequency division output signal of the frequency dividing means to coincide with the predetermined cycle based upon the logical regulating data.

7. A logical regulating circuit according to claim 1; wherein the frequency dividing means comprises a plurality of flip-flop circuits serially connected so as to sequentially divide by one-half the frequency of the reference clock.

8. A logical regulating circuit according to claim 1; wherein the logical regulating means includes means for adjusting the frequency dividing means at predetermined time periods in response to a periodic control signal generated by the frequency dividing means.

9. A logical regulating circuit according to claim 8; wherein the frequency dividing means comprises a plurality of flip-flop circuits serially connected so as to sequentially divide by one-half the frequency of the reference clock; and the logical regulating means comprises a logical circuit for resetting a selected one of the flip-flops at predetermined time intervals in accordance with the logical regulating data set by the logical regulating data setting means.

10. A logical regulating circuit according to claim 9; wherein the means for shifting comprises a set of selected connections between reset inputs of selected ones of the flip-flops and a logic circuit having the control signal as an input such that the absolute value of the range of regulation of the logical regulating means is adjusted by a predetermined multiple.

11. An electronic timepiece having a display driving means for outputting a display drive output signal and display means for receiving the display drive output signal to display time information, the electronic timepiece further comprising:

a logical regulating circuit including oscillating means for outputting a reference clock; frequency dividing means for sequentially frequency-dividing the reference clock and producing a divided output signal; logical regulating data setting means for setting predetermined logical regulating data used for selectively altering a frequency dividing ratio of the frequency dividing means to adjust the frequency of the divided output signal to a predetermined value; logical regulating means for adjusting the frequency at predetermined periods in accordance with the logical regulating data set in the logical regulating data setting means in a forward or reverse direction to control the frequency of the divided output signal to compensate for a deviation in oscillation frequency of the oscillating means from a desired frequency; and means for shifting a range of regulation of the logical regulating means by controlling the logical regulating means to adjust the frequency dividing means such that the frequency of the divided output signal corresponds to the predetermined value, wherein the display driving means outputs the display drive output signal based on the divided output signal output by the frequency dividing means.

12. An electronic device having a logical regulating circuit comprising: oscillating means for outputting a reference clock; frequency dividing means for receiving and sequentially frequency-dividing the reference clock to generate a time reference signal; logical regulating data setting means for setting predetermined logical regulating data used for selectively altering a frequency dividing ratio of the frequency dividing means to adjust the frequency of the divided output signal; logical regulating means for adjusting the frequency dividing means based on the logical regulating data set in the logical regulating data setting means at predetermined periods to adjust time precision of the time reference signal in a forward or reverse direction to compensate for a deviation in oscillation frequency of the oscillating means from a desired frequency; means for shifting a regulating range of the logical regulating means to shift an adjustment range of the logical regulating means such that the time reference signal corresponds to a predetermined value; a display driving means for outputting a display drive output signal based on the time reference signal output from the frequency dividing means; and a display means for receiving the display drive output signal to display time information.

13. A circuit for compensating for a deviation in oscillation frequency of a clock signal, comprising: an oscillation circuit for producing a clock signal; a frequency divider having a plurality of flip-flops serially arranged to sequentially divide the frequency of the clock signal; a logical regulating circuit connected to selected ones of the flip-flops for controlling the frequency dividing operation of the frequency divider by resetting one or more selected ones of the flip-flops at predetermined time intervals in accordance with preset logical regulating data, such that a selected cycle of a respective divided output signal of a selected flip-flop coincides with a predetermined cycle; and a logical regulating shift circuit connected to one or more of the flip-flops other than the selected ones to which the logical regulating circuit is connected for resetting one or more of the other flip-flops at the predetermined time intervals to increase the range of regulation of the logical regulating circuit.

14. A circuit for compensating according to claim 13; wherein the logical regulating shift circuit comprises a set of interconnections between reset inputs of the one or more other flip-flops and a logic circuit responsive to a periodic control signal, the interconnections being determined based upon a desired amount of compensation needed based upon a deviation in oscillation frequency of the clock signal from a desired frequency and a maximum range of compensation of the logical regulating circuit.

* * * * *